US012444866B2

United States Patent
Costello et al.

(10) Patent No.: US 12,444,866 B2
(45) Date of Patent: Oct. 14, 2025

(54) ELECTRICAL CONNECTOR SYSTEM (71) Applicants: TE CONNECTIVITY CORPORATION, Berwyn, PA (US); TYCO ELECTRONICS JAPAN G.K., Kawasaki (JP)

(72) Inventors: Brian Patrick Costello, Scotts Valley, CA (US); Naoki Hashimoto, Tokyo (JP)

(73) Assignee: TE CONNECTIVITY SOLUTIONS GmbH et al., Schaffhausen (CH)

( * ) Notice: Subject to any disclaimer, the term of this patent is extended or adjusted under 35 U.S.C. 154(b) by 10 days.

(21) Appl. No.: 16/353,056

(22) Filed: Mar. 14, 2019

(65) Prior Publication Data
US 2020/0295483 A1    Sep. 17, 2020

(51) Int. Cl.
H01R 13/629    (2006.01)
H01R 12/70    (2011.01)
H01R 12/71    (2011.01)
H01R 13/6583    (2011.01)
H01R 13/6588    (2011.01)
(Continued)

(52) U.S. Cl.
CPC ....... H01R 12/716 (2013.01); H01R 12/7058 (2013.01); H01R 13/62983 (2013.01); H01R 13/6583 (2013.01); H01R 13/6588 (2013.01); H01R 13/6595 (2013.01); H05K 1/111 (2013.01); H05K 1/117 (2013.01)

(58) Field of Classification Search
None
See application file for complete search history.

(56) References Cited

U.S. PATENT DOCUMENTS 2,811,700 A * 10/1957 Kuch ............... H01R 12/721
439/59
4,830,623 A * 5/1989 Owens ............ H05K 7/1061
439/67
(Continued)

FOREIGN PATENT DOCUMENTS

CN    107039855 A    8/2017
CN    206895075 U    1/2018
(Continued)

OTHER PUBLICATIONS

Chinese Office Action with English translation thereof, dated Dec. 11, 2023 in Application No. 202010173247.9, 21 pages.

Primary Examiner — Felix O Figueroa (57) ABSTRACT

An electrical connector system includes a circuit card assembly and a pluggable module. The circuit card assembly including a host circuit board, a socket connector mounted to the host circuit board, and a guide rail extending along the host circuit board. The socket connector has a socket substrate having upper contacts having mating interfaces being accessible from above the socket connector and being coplanar. The guide rail has a guide feature and a module actuator. The pluggable module includes a module body operatively engaging the guide rail to guide mating of the module body with the guide rail in a module mating direction. The pluggable module includes an actuation feature engaging the module actuator to force mating of module contacts with the upper contacts in a contact mating direction transverse to the module mating direction.

15 Claims, 11 Drawing Sheets (51) Int. Cl.
*H01R 13/6595* (2011.01)
*H05K 1/11* (2006.01)

(56) References Cited

U.S. PATENT DOCUMENTS

| | | | | |
|---|---|---|---|---|
| 5,757,998 A * | 5/1998 | Thatcher | ............... | G02B 6/4201 |
| | | | | 385/75 |
| 6,135,793 A * | 10/2000 | Babineau | ........... | H01R 13/6582 |
| | | | | 439/92 |
| 6,485,322 B1 * | 11/2002 | Branch | .............. | H01R 13/6271 |
| | | | | 439/357 |
| 6,532,155 B2 * | 3/2003 | Green | ................... | G02B 6/4277 |
| | | | | 361/730 |
| 6,846,115 B1 * | 1/2005 | Shang | ................ | H01R 12/7076 |
| | | | | 385/92 |
| 7,442,047 B1 * | 10/2008 | Schmidgall | ............ | H01R 12/62 |
| | | | | 439/67 |
| 8,098,326 B2 * | 1/2012 | Takashima | .............. | H04N 23/56 |
| | | | | 439/246 |
| 8,109,793 B2 * | 2/2012 | Faisandier | ......... | A61B 5/04325 |
| | | | | 439/630 |
| 8,454,379 B2 * | 6/2013 | Lee | ........................... | B01L 7/00 |
| | | | | 439/297 |
| 9,048,594 B2 * | 6/2015 | Lim | ....................... | H01R 12/71 |
| 9,437,949 B2 | 9/2016 | Behziz et al. | | |

FOREIGN PATENT DOCUMENTS

| | | |
|---|---|---|
| CN | 207069194 U | 3/2018 |
| CN | 207303526 U | 5/2018 |
| CN | 207338687 U | 5/2018 |
| FR | 2120409 A5 | 8/1972 |

\* cited by examiner

ELECTRICAL CONNECTOR SYSTEM

BACKGROUND OF THE INVENTION

The subject matter herein relates generally to electrical connector systems.

Some communication systems utilize communication connectors, such as card edge connectors to interconnect various components of the system for data communication. Some known communication systems use pluggable modules, such as I/O modules, that are electrically connected to the card edge connectors. The pluggable modules have module circuit boards having card edges that are mated with the card edge connectors during the mating operation. The module circuit boards are typically limited to two rows of contacts with a first row of the contacts on the upper surface of the module circuit board and with a second row of the contacts on the lower surface of the module circuit board. As such, the density of the communication system is limited by the mating interface defined by the card edge connector and the module circuit board.

A need remains for a communication system having improved contact density to handle a greater number of high-speed signals transmitted through the communication system.

BRIEF DESCRIPTION OF THE INVENTION

In one embodiment, an electrical connector system is provided including a circuit card assembly and a pluggable module. The circuit card assembly including a host circuit board, a socket connector mounted to the host circuit board, and a guide rail extending along the host circuit board. The host circuit board has a contact array of circuit board contacts on an upper surface of the host circuit board. The socket connector has a socket substrate having an upper contact array of upper contacts and a lower contact array of lower contacts electrically connected to corresponding upper contacts. The upper contacts have mating interfaces being accessible from above the socket connector and being coplanar. The lower contacts are electrically connected to corresponding circuit board contacts. The guide rail has a guide feature and a module actuator. The pluggable module includes a module body having a top and a bottom extending between a front and a rear. The module body has a longitudinally extending guide feature operatively engaging the guide rail to guide mating of the module body with the guide rail in a module mating direction parallel to the upper surface of the host circuit board. The module body has a window at the bottom proximate to the rear. The pluggable module includes a module circuit board held by the module body having a module contact array of module contact pads aligned with the window with the module contacts exposed from below the module body for mating with corresponding upper contacts of the circuit card assembly. The pluggable module includes an actuation feature associated with the module body engaging the module actuator of the circuit card assembly to force mating of the module contacts with the upper contacts of the circuit card assembly in a contact mating direction transverse to the module mating direction.

In another embodiment, a circuit card assembly is provided including a host circuit board having a contact array of circuit board contacts on an upper surface of the host circuit board and a socket connector mounted to the upper surface of the host circuit board. The socket connector has a socket substrate having an upper contact array of upper contacts and a lower contact array of lower contacts electrically connected to corresponding upper contacts. The upper contacts have mating interfaces configured to be electrically connected to module contacts of a pluggable module mated to the circuit card assembly. The mating interfaces are accessible from above the socket connector and are coplanar for mating with the module contacts. The lower contacts are electrically connected to corresponding circuit board contacts. The circuit card assembly includes a guide rail extending along the upper surface of the host circuit board. The guide rail has a guide feature to guide mating of the pluggable module with the socket connector in a module mating direction parallel to the upper surface of the host circuit board. The guide rail has a module actuator configured to engage the pluggable module and move the pluggable module in a contact mating direction transverse to the module mating direction. The module actuator forces the module contacts to mate with the upper contacts in the contact mating direction.

In a further embodiment, a pluggable module is provided including a module body extending between a front and a rear and having a top and a bottom between the front and the rear. The module body has a longitudinally extending guide feature to guide mating of the module body with a guide feature of a circuit card assembly in a module mating direction. The module body has a window at the bottom proximate to the rear. The pluggable module includes a module circuit board held by the module body having a mating edge between an upper surface and a lower surface. The module circuit board has a module contact array of module contact pads at the lower surface proximate to the mating edge. The module contact array is aligned with the window at the bottom of the module body with the module contacts exposed from below the module body for mating with corresponding contacts of the circuit card assembly. The pluggable module includes an actuation feature associated with the module body. The actuation feature is configured to engage an actuation feature of the circuit card assembly to force mating of the module contacts with the contacts of the circuit card assembly in a contact mating direction transverse to the module mating direction.

DETAILED DESCRIPTION OF THE INVENTION

Figure 1:
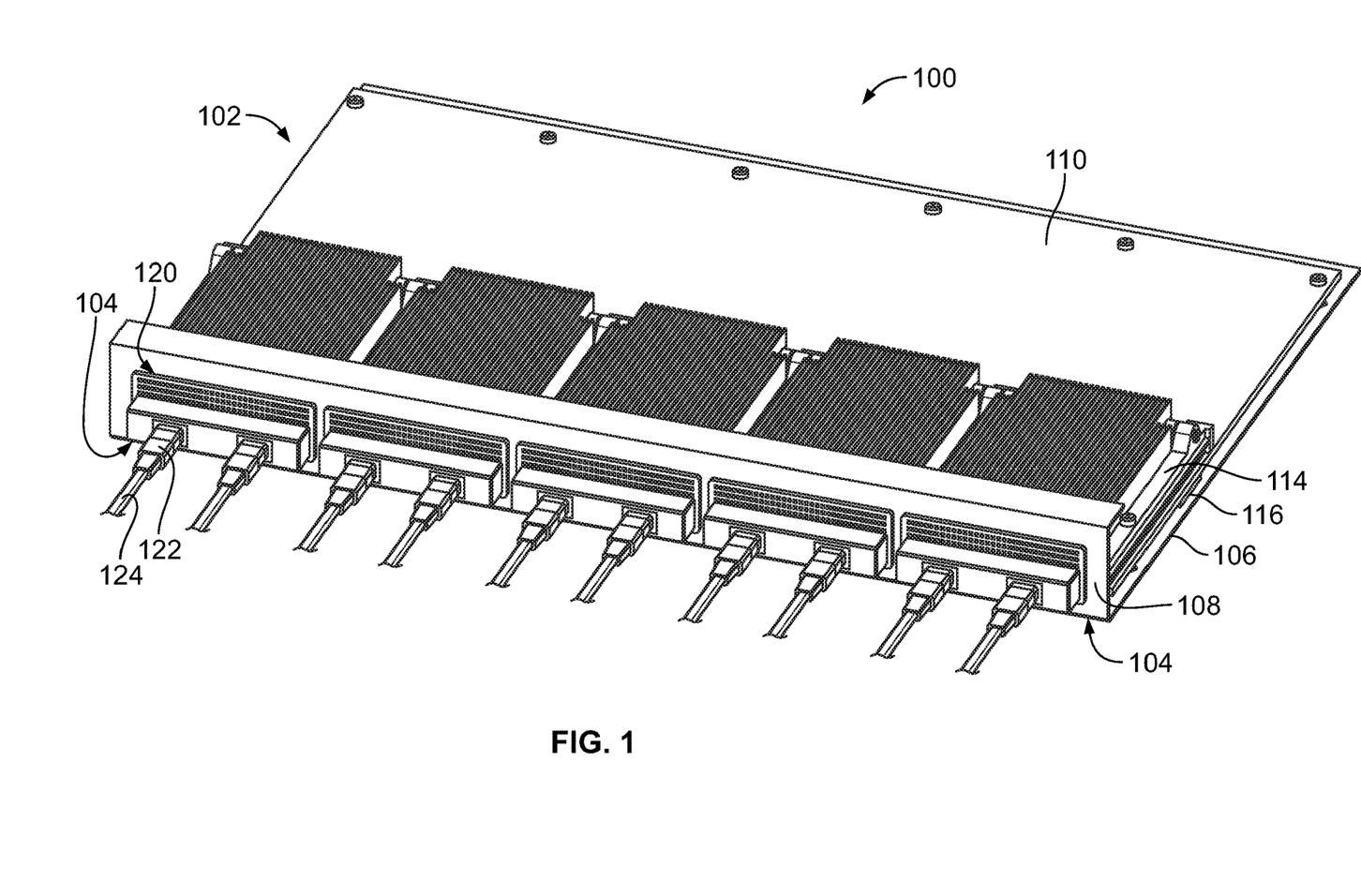
FIG. 1 is a front perspective view of an electrical connector system formed in accordance with an exemplary embodiment.

FIG. 1 is a front perspective view of an electrical connector system 100 formed in accordance with an exemplary embodiment. The electrical connector system 100 includes a circuit card assembly 102 and a pluggable module 104 mated with the circuit card assembly 102. In various embodiments, multiple pluggable modules 104 may be mated with the circuit card assembly 102. The pluggable modules 104 may be I/O modules forming part of a communication system, such as a server or network switch. The pluggable modules 104 may be removably coupled to the circuit card assembly 102.

The circuit card assembly 102 includes a tray 106 at a bottom of the circuit card assembly 102 and a panel 108 at a front of the circuit card assembly 102. The circuit card assembly 102 includes a host circuit board 110 held by the tray 106. Optionally, multiple host circuit boards 110 may be held by the tray 106. The tray 106 may be loaded into a rack or cabinet of a communication system, such as a rack or cabinet of a server or network switch. The circuit card assembly 102 includes a socket connector 112 (shown in FIG. 2) mounted to the host circuit board 110. Multiple socket connectors 112 may be mounted to the host circuit board 110, such as for interfacing with corresponding pluggable modules 104. The pluggable modules 104 are electrically connected to the host circuit board 110 through the socket connectors 112. The circuit card assembly 102 includes guide rails 114 extending along the host circuit board 110 for guiding mating of the pluggable modules 104 with the socket connectors 112. In various embodiments, the circuit card assembly 102 includes backer plates 116 used to provide mechanical support to the board and to secure the guide rails 114 to the host circuit board 110, such as using fasteners passing through the host circuit board 110. In other various embodiments, rather than using the backer plates 116, guide rails 114 may be coupled to the bottom of the host circuit board 110 for receiving pluggable modules 104 on both sides of the host circuit board 110 in a belly-to-belly mounting arrangement.

In the illustrated embodiment, the panel 108 includes a plurality of panel openings 120 defining ports configured to receive corresponding pluggable modules 104. The pluggable modules 104 extend through the panel 108 for mating with the circuit card assembly 102. A portion of the pluggable module 104 is loaded rearward of the panel 108 for interfacing with the socket connector 112. A portion of the pluggable module 104 is located forward of the panel 108 for access by an operator. For example, plug connectors 122 may be plugged into the pluggable modules 104. The cables 124 extend from the plug connectors 122. In alternative embodiments, the cables 124 may extend into the pluggable module 104 for direct electrical connection to the pluggable module 104 and not be detachable.

Figure 2:
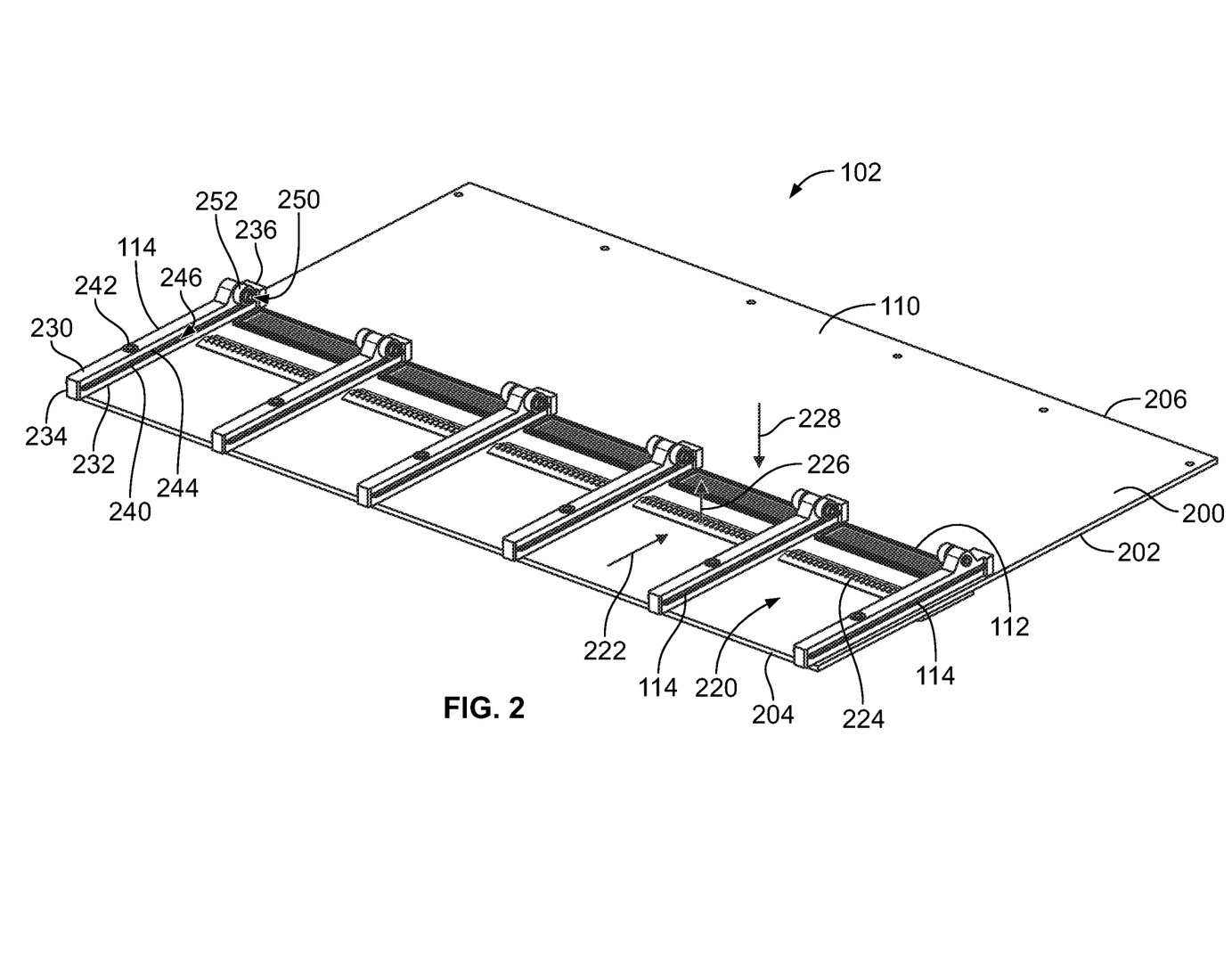
FIG. 2 is a front perspective view of a circuit card assembly of the electrical connector system in accordance with an exemplary embodiment.
Figure 3:
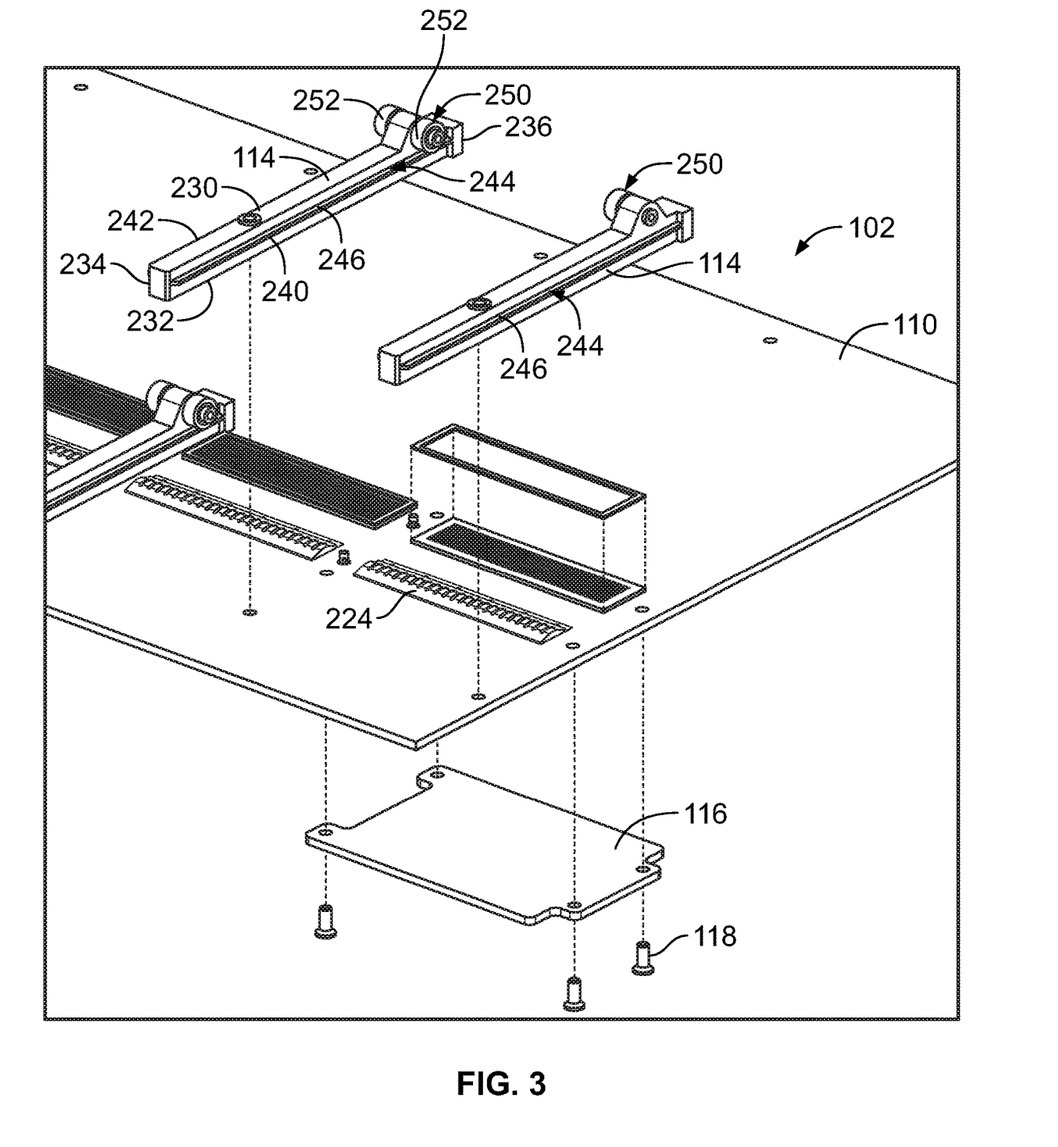
FIG. 3 is an exploded view of a portion of the circuit card assembly in accordance with an exemplary embodiment.

FIG. 2 is a front perspective view of the circuit card assembly 102 in accordance with an exemplary embodiment. FIG. 3 is an exploded view of a portion of the circuit card assembly 102 in accordance with an exemplary embodiment. In the illustrated embodiment, five socket connectors 112 are mounted to the host circuit board 110. Greater or fewer socket connectors 112 may be provided in alternative embodiments. The guide rails 114 are provided for each of the socket connectors 112 to guide mating of the pluggable module 104 (shown in FIG. 1) with the corresponding socket connector 112. In various embodiments, the guide rails 114 are provided between the socket connectors 112 such that each guide rail 114 is capable of guiding pluggable modules 104 on both sides thereof. In other various embodiments, to guide rails 114 may be provided for each socket connector 112 and arranged back to back or spaced apart depending on the particular application and desired spacing.

The host circuit board 110 includes an upper surface 200 and a lower surface 202 extending between a front 204 and a rear 206 of the host circuit board 110. The socket connectors 112 and the guide rails 114 are mounted to the upper surface 200 at or near the front 204. Other locations are possible in alternative embodiments. The backer plates 116 may be used to secure the guide rails 114 to the host circuit board 110 using fasteners 118. The backer plates 116 may provide rigidity for the host circuit board 110 in the vicinity of the socket connectors 112 to prevent or resist warping of the host circuit board 110 at the mounting locations of the socket connectors 112. In various embodiments, the socket connectors 112 and the corresponding guide rails 114 may be provided on both the upper surface 200 and the lower surface 202 for receiving the pluggable modules 104 on both sides of the host circuit board 110 in the belly-to-belly mounting arrangement.

The host circuit board 110 includes a contact array (not shown) of circuit board contacts (not shown) on the upper surface 200. The circuit board contacts may be defined by circuits of the host circuit board 110, such as pads, vias, traces and the like. In an exemplary embodiment, the circuit board contacts are solder pads. In other various embodiments, the circuit board contacts are plated vias.

The guide rails 114 are mounted to the host circuit board 110 and form a module channel 220 that receives a corresponding pluggable module 104 in a module mating direction 222. Optionally, the module mating direction 222 may be generally parallel to the upper surface 200 of the host circuit board 110. For example, the module mating direction 222 may be generally horizontal. The guide rails 114 are provided on opposite sides of the module channel 220. The socket connector 112 is located in the module channel 220 such as at or near a rear end of the module channel 220.

In an exemplary embodiment, the circuit card assembly 102 includes a lifter spring 224 in the module channel 220 forward of the socket connector 112. The lifter spring 224 is configured to lift the pluggable module 104 upward off the host circuit board 110 in a lifting direction 226 during mating of the pluggable module 104 with the circuit card assembly 102. The lifting direction 226 may be an upward direction away from the upper surface 200 of the host circuit board 110. The lifter spring 224 is used to protect the socket connector 112 during mating and un-mating of the pluggable module 104 with the socket connector 112. By lifting the pluggable module 104 upward away from the socket connector 112, the contacts of the pluggable module 104 and the socket connector 112 are protected from damage, wear and short-circuiting.

In an exemplary embodiment, the guide rail 114 guides the pluggable module 104 in a contact mating direction 228, generally opposite the lifting direction 226 to seat the pluggable module 104 against the socket connector 112. Contacts of the pluggable module 104 and the socket connector 112 are electrically connected when the pluggable module 104 is moved in the contact mating direction 228. In an exemplary embodiment, the pluggable module 104 is moved in the contact mating direction 228 at the end of the loading process of the pluggable module 104 into the module channel 220, such as when the pluggable module 104 is properly aligned with the socket connector 112.

Each guide rail 114 includes a top 230 and a bottom 232 extending between a front 234 and a rear 236. The bottom 232 is mounted to the upper surface 200 of the host circuit board 110. The front 234 may be located at or near the front 204 of the host circuit board 110. Optionally, the front 234 may extend forward of the front 204 of the host circuit board 110. In other various embodiments, the front 234 may be recessed rearward of the front 204 of the host circuit board 110.

The guide rail 114 includes a first side 240 and a second side 242. Optionally, both sides 240, 242 may face corresponding module channels 220 for guiding corresponding pluggable modules 104. In other various embodiments, only the first side 240 or the second side 242 may face the corresponding module channel 220 for interfacing with and guiding the corresponding pluggable module 104. In an exemplary embodiment, the guide rail 114 includes guide features 244 on the first side 240 and/or the second side 242. The guide features 244 guide mating of the pluggable module 104 with the circuit card assembly 102. In an exemplary embodiment, the guide features 244 is a longitudinally extending rib 246 extending between the front 234 and the rear 236. Other types of guide features may be used in alternative embodiments, such as a groove, a pin, a shoulder, and the like. Optionally, the rib 246 may be approximately centered between the top 230 and the bottom 232.

The guide rail 114 includes an actuation feature configured to interface with the pluggable module 104 and control mating of the pluggable module 104 with the socket connector 112. In an exemplary embodiment, the actuation feature is a module actuator 250. In the illustrated embodiment, the module actuator 250 is located proximate to the rear 236 of the guide rail 114. The module actuator 250 may be located at the top 230 of the guide rail 114. In the illustrated embodiment, the module actuator 250 includes a roller bearing 252 rotatably coupled to the guide rail 114. The roller bearing 252 rotates when engaging the pluggable module 104 to reduce mating friction with the pluggable module 104. Other types of module actuators 250 may be provided in alternative embodiments, such as a cam element, a rocker element, a pin, a ramp, or another type of actuator. The module actuator 250 is used to position the pluggable module 104 relative to the socket connector 112, such as for mating contacts of the pluggable module 104 with contacts of the socket connector 112. The module actuator 250 may act on the pluggable module 104 in a direction non-parallel to, such as opposite to, the biasing force of the lifter spring 224. For example, the lifter spring 224 may lift the pluggable module 104 upward in the lifting direction 226 while the module actuator 250 pushes the pluggable module 104 downward in the contact mating direction 228 as the pluggable module 104 is loaded into the module channel 220.

Figure 4:
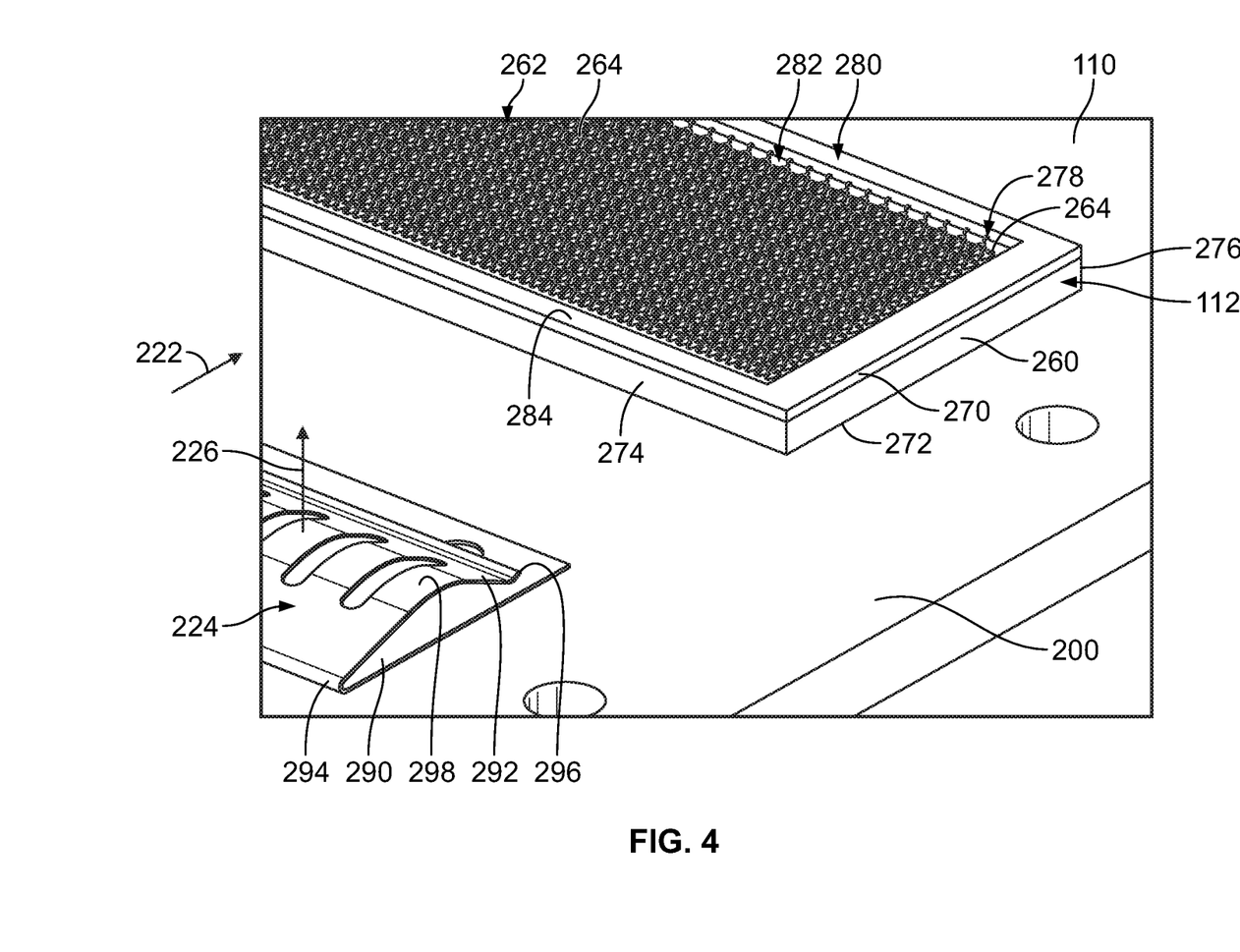
FIG. 4 is an enlarged perspective view of a portion of the circuit card assembly showing a portion of a socket connector in accordance with an exemplary embodiment.
Figure 5:
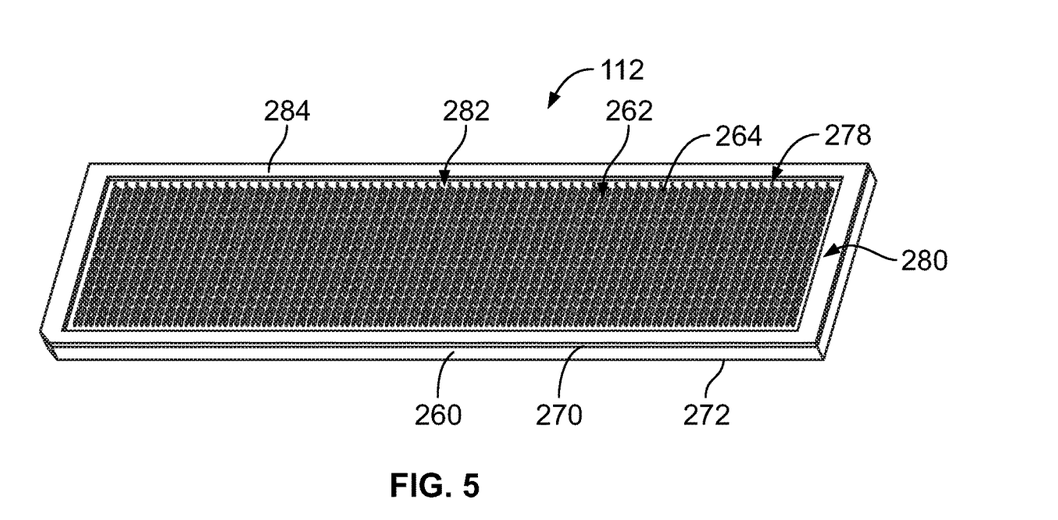
FIG. 5 is a top perspective view of the socket connector in accordance with an exemplary embodiment.
Figure 6:
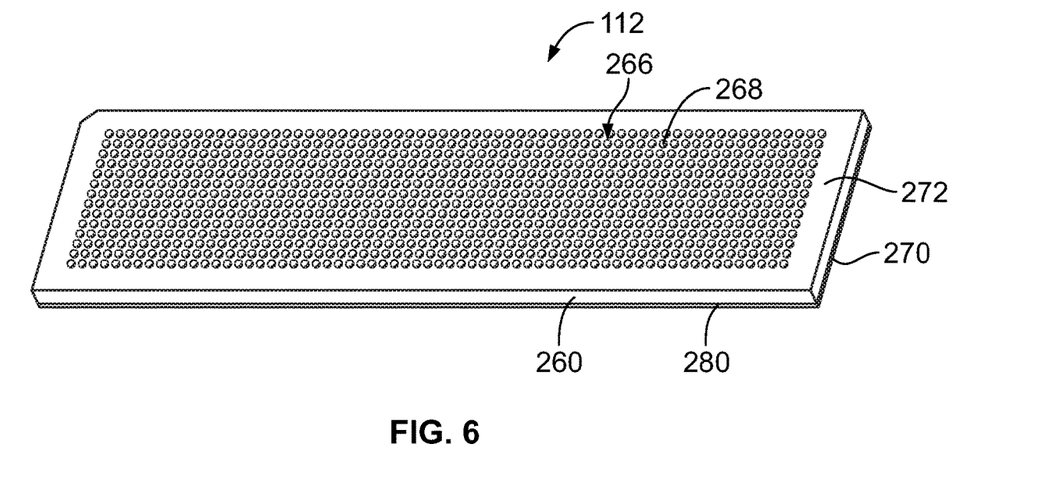
FIG. 6 is a bottom perspective view of the socket connector in accordance with an exemplary embodiment.

FIG. 4 is an enlarged perspective view of a portion of the circuit card assembly 102 showing a portion of the socket connector 112 and the lifter spring 224 on the host circuit board 110. FIG. 5 is a top perspective view of the socket connector 112 in accordance with an exemplary embodiment. FIG. 6 is a bottom perspective view of the socket connector 112 in accordance with an exemplary embodiment.

The socket connector 112 includes a socket substrate 260 having an upper contact array 262 of upper contacts 264 (FIG. 5) and a lower contact array 266 of the lower contacts 268 (FIG. 6). The socket substrate 260 extends between the upper surface 270 and a lower surface 272. The socket substrate 260 extends between a front 274 of the socket connector 112 and a rear 276 of the socket connector 112. In an exemplary embodiment, the socket substrate 260 is a circuit board. The socket substrate 260 includes circuits, such as pads, traces, vias and the like routed along one or more layers of the socket substrate 260. For example, the socket substrate 260 may include plated vias extending between the upper surface 270 and the lower surface 272 for electrically connecting the upper contacts 264 with corresponding lower contacts 268. In other various embodiments, the upper contacts 264 may extend entirely through the socket substrate 260 for directly connecting to the lower contacts 268. In other various embodiments, the upper contacts 264 may be integral with corresponding lower contacts 268 is part of a unitary, monolithic contact structure arranged at both the upper surface 270 and the lower surface 272.

The lower contacts 268 are configured to be electrically connected with corresponding circuit board contacts of the host circuit board 110. For example, the lower contacts 268 may be soldered to the circuit board contacts. In an exemplary embodiment, the lower contacts 268 are solder balls. The lower contact array 266 is a ball grid array. Other types of contacts may be provided in alternative embodiments.

The upper contacts 264 are configured to interface with the pluggable module 104. In an exemplary embodiment, the upper contacts 264 are spring contacts having mating interfaces 278 configured to be mated with the pluggable module 104. The spring contacts are deflectable when mated with the pluggable module 104. For example, the pluggable module 104 may be coupled to the socket connector 112 from above to compress the upper contacts 264 causing the mating interfaces 278 to be spring biased against the pluggable module 104. In an exemplary embodiment, the mating interfaces 278 are co-planer for mating with the pluggable module 104 from above. In various embodiments, the upper contacts 264 are soldered to corresponding conductors of the socket substrate 260 at the upper surface 270. In other various embodiments, the upper contacts 264 are press-fit into vias of the socket substrate 260.

In an exemplary embodiment, the socket connector 112 includes a socket frame 280 coupled to the socket substrate 260. In the illustrated embodiment, the socket frame 280 is coupled to the upper surface 270 of the socket substrate 260. In other various embodiments, the socket frame 280 may enclosed the socket substrate 260, such as along the sides and/or the ends of the socket substrate 260. The socket frame 280 may be coupled to the host circuit board 110 in various embodiments, such as to secure the socket substrate 260 relative to the host circuit board 110. The socket frame 280 surrounds a socket cavity 282 around the upper contacts 264.

The socket frame 280 includes a support surface 284 at a top of the socket frame 280. The support surface 284 may support the pluggable module 104 to prevent the pluggable module 104 from over compressing or damaging the upper contacts 264. The socket frame 280 limits compression of the upper contacts 264 by the pluggable module 104. In an exemplary embodiment, the socket frame 280 is a plastic frame having frame members surround the socket cavity 282. For example, the frame members may extend along both sides and both ends of the socket substrate 260 to form a rectangular socket cavity 282. The socket cavity 282 may have other shapes in alternative embodiments. The socket frame 280 may have other frame members extending across the socket cavity 282 in alternative embodiments.

In an exemplary embodiment, the lifter spring 224 includes a base 290 and a spring member 292 extending from the base 290. The base 290 is mounted to the host circuit board 110. The spring member 292 extends upward from the base 290 between a fixed end 294 and a free end 296. The spring member 292 is folded over at the fixed end 294. The spring member 292 may be bent or curved to form a lifting surface 298 between the fixed end 294 and the free end 296. The lifting surface 298 is configured to engage the pluggable module 104 to lift the pluggable module 104 away from the host circuit board 110.

Figure 7:
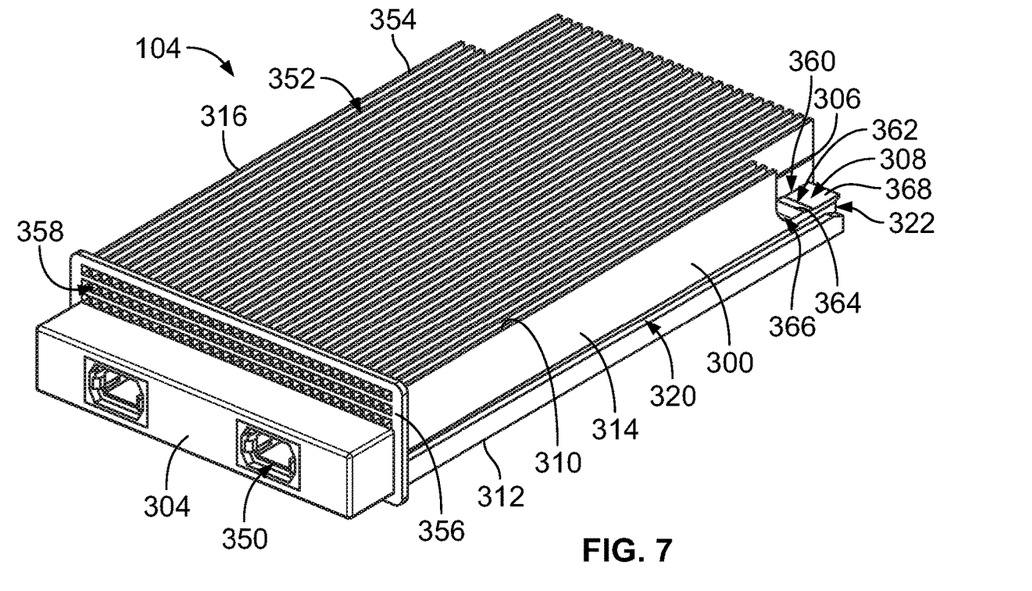
FIG. 7 is a front perspective view of a pluggable module of the electrical connector system in accordance with an exemplary embodiment.
Figure 8:
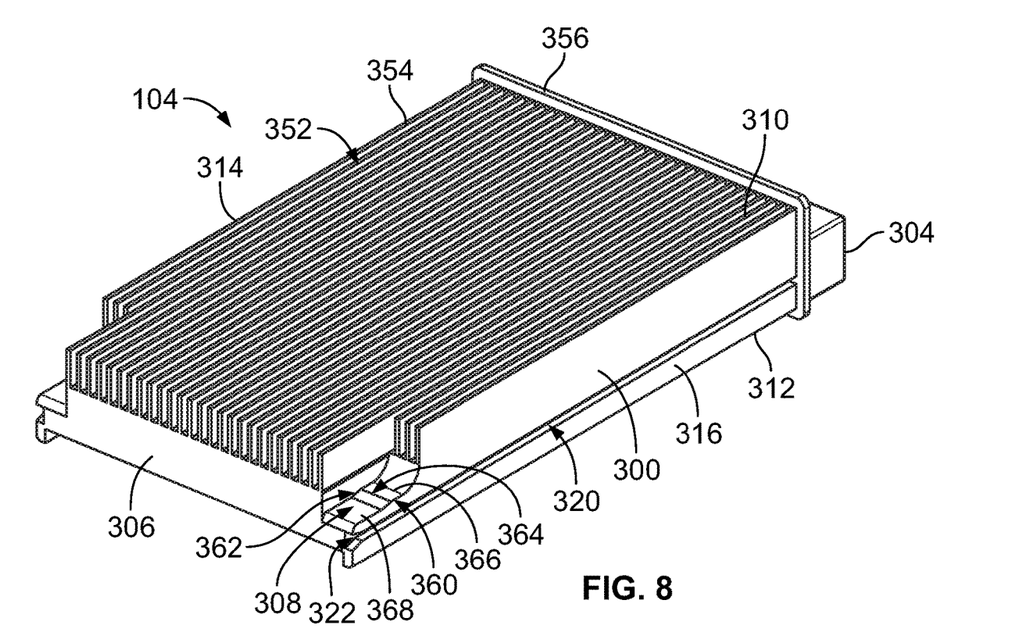
FIG. 8 is a rear perspective view of the pluggable module in accordance with an exemplary embodiment.
Figure 9:
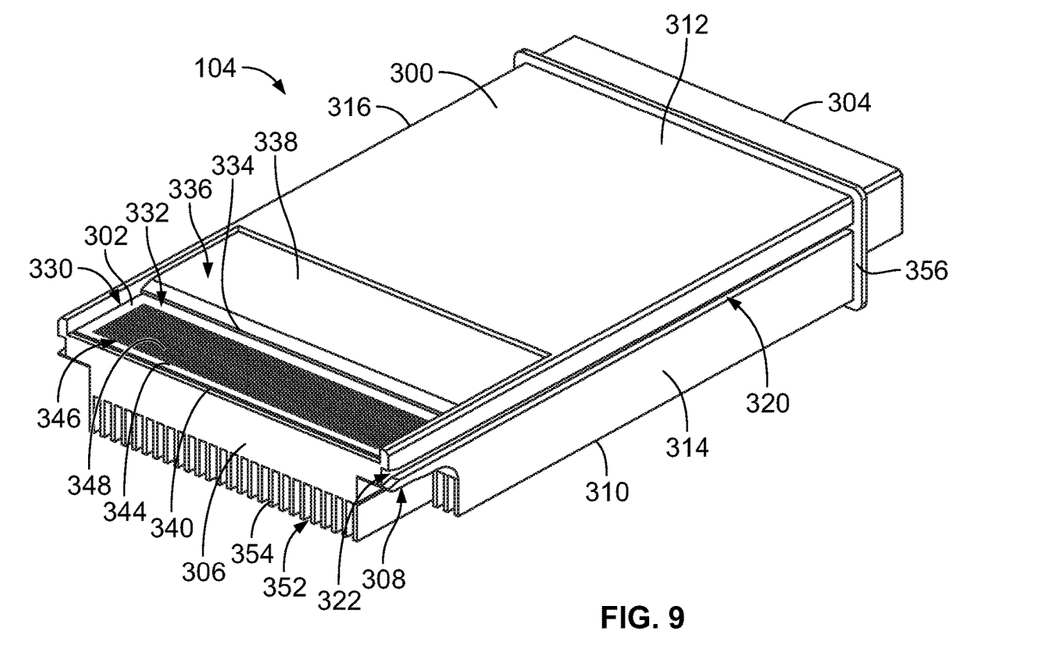
FIG. 9 is a bottom perspective view of the pluggable module in accordance with an exemplary embodiment.

FIG. 7 is a front perspective view of the pluggable module 104 in accordance with an exemplary embodiment. FIG. 8 is a rear perspective view of the pluggable module 104 in accordance with an exemplary embodiment. FIG. 9 is a bottom perspective view of the pluggable module 104 in accordance with an exemplary embodiment.

The pluggable module 104 includes a module body 300 holding a module circuit board 302 (FIG. 9). The module body 300 extends between a front 304 and a rear 306. In an exemplary embodiment, the pluggable module includes an actuation feature 308 at or near the rear 306. The rear 306 of the pluggable module 104 is configured to be loaded into the circuit card assembly 102 for mating with the circuit card assembly 102. The actuation feature 308 is used to position the pluggable module 104 for mating with the socket connector 112 (shown in FIG. 4). The module body 300 includes a top 310 and a bottom 312. The module body 300 includes a first side 314 and a second side 316. In the illustrated embodiment, the pluggable module 104 includes a pair of the actuation features 308 at the rear 306 at the first side 314 and the second side 316. The actuation features 308 are exposed at the top 310. The actuation features 308 may be located at other locations in alternative embodiments.

In an exemplary embodiment, the module body 300 includes guide features 320 configured to interact with the guide features 244 of the guide rail 114 (shown in FIG. 4) to guide mating of the module body 300 with the circuit card assembly 102. Optionally, the guide features 320 extend longitudinally along the sides 314, 316 between the front 304 and the rear 306. In the illustrated embodiment, the guide features 320 include channels 322 along the first and second sides 314, 316. The channels 322 receive the ribs 246 (shown in FIG. 4) of the guide rails 114. Other types of guide features may be provided in alternative embodiments, such as ribs, pins, shoulders, and the like. In the illustrated embodiment, the channels 322 are open at the rear 306 for receiving the ribs 246 when the pluggable module 104 is mated with the circuit card assembly 102.

In an exemplary embodiment, the module body 300 includes a cavity 330 (FIG. 9) that receives the module circuit board 302. The module body 300 includes a window 332 open at the bottom 312 to expose the module circuit board 302 in the cavity 330. Optionally, the window 332 may be located proximate to the rear 306. In an exemplary embodiment, the module body 300 includes a lip 334 that transitions from the window 332 to a pocket 336 formed in the bottom 312 forward of the window 332. The pocket 336 includes a platform 338 that is recessed below the bottom 312. The lip 334 transitions to the platform 338. The pocket 336 is configured to receive the lifter spring 224 (shown in FIG. 4). The lifter spring 224 is configured to engage the platform 338 to lift the pluggable module 104 during mating with the circuit card assembly 102.

The module circuit board 302 includes a mating edge 340 (FIG. 9) extending between an upper surface 342 (shown in FIG. 11) and a lower surface 344. The lower surface 344 is exposed in the window 332 (FIG. 9) at the bottom 312 of the module body 300. The module circuit board 302 includes a module contact array 346 of module contacts 348 at the lower surface 344 proximate to the mating edge 340. In an exemplary embodiment, the module contacts 348 are defined by circuits of the module circuit board 302, such as pads, traces, vias, and the like. In alternative embodiments, the module contacts 348 may be spring beam contacts having deflectable spring beams defining a compressible mating interface. The module contacts 348 are arranged in a plurality of rows and a plurality of columns. In an exemplary embodiment, the module contacts 348 are arranged in greater than three rows and arranged in greater than three columns. In the illustrated embodiment, the module contacts 348 are arranged in fourteen rows and sixty five columns; however, the module contacts 348 may be arranged in greater or fewer rows and in greater or fewer columns. Having a large number of rows and/or columns provides a dense mating interface for the pluggable module 104 having many high-speed signal lines through the pluggable module 104.

In an exemplary embodiment, the pluggable module 104 includes one or more optical connectors 350 at the front 304. The optical connectors 350 are configured to receive the optical plug connectors 122 (shown in FIG. 1). The optical connectors 350 are optically connected to the module circuit board 302. In alternative embodiments, the cables 124 (shown in FIG. 1) may be directly terminated to the module circuit board 302, such as being terminated to optical components that are attached to the module circuit board 302. Alternately, the connectors 350 could be electrical connectors and the plug connectors could be high speed electrical connectors terminated to high performance differential pair cables.

In an exemplary embodiment, the pluggable module 104 includes a heat sink 352 at the top 310. The heat sink 352 includes a plurality of heat dissipating fins 354 extending along the top 310. The heat dissipating fins 354 may extend longitudinally between the front 304 and the rear 306. In an exemplary embodiment, the pluggable module 104 includes a flange 356 at the front 304. The flange 356 includes openings 358 that are open to the channels between the heat dissipating fins 354. The openings 358 allow airflow through the flange 356 for cooling the heat dissipating fins 354.

The actuation features 308 transitions the generally horizontal loading of the pluggable module 104 into a generally vertical mating of the pluggable module 104. In an exemplary embodiment, the actuation feature 308 includes a cam surface 360. Optionally, the cam surface 360 may be nonplanar. The cam surface 360 may be nonparallel to the bottom 312 of the module body 300. When the cam surface 360 interfaces with the module actuator 250, the pluggable module 104 is moved in the contact mating direction 228.

For example, the horizontal loading of the pluggable module 104 in the module mating direction 222 is transferred to at least partial vertical movement of the pluggable module 104 in the contact mating direction 228. The cam surface 360 forces the rear 306 of the module body 300 downward for mating the module contacts 348 with the upper contacts 264 (shown in FIG. 4) of the circuit card assembly 102. In an exemplary embodiment, the actuation feature 308 includes a detent 362 defined by a bump 364 and a pocket 366 forward of the bump 364. The bump 364 is located forward of a rear platform 368 at the rear 306. The bump 364 is elevated relative to the rear platform 368. When the module actuator 250 transitions from the rear platform 368 along the bottom 312 into the pocket 366, the rear 306 of the module body 300 is moved downward to compress the module contacts 348 against the upper contacts 264. Other types of actuation features 308 may be provided in alternative embodiments. For example, the actuation features 308 may be cam followers, slots, pins, rockers, and the like.

Figure 10:
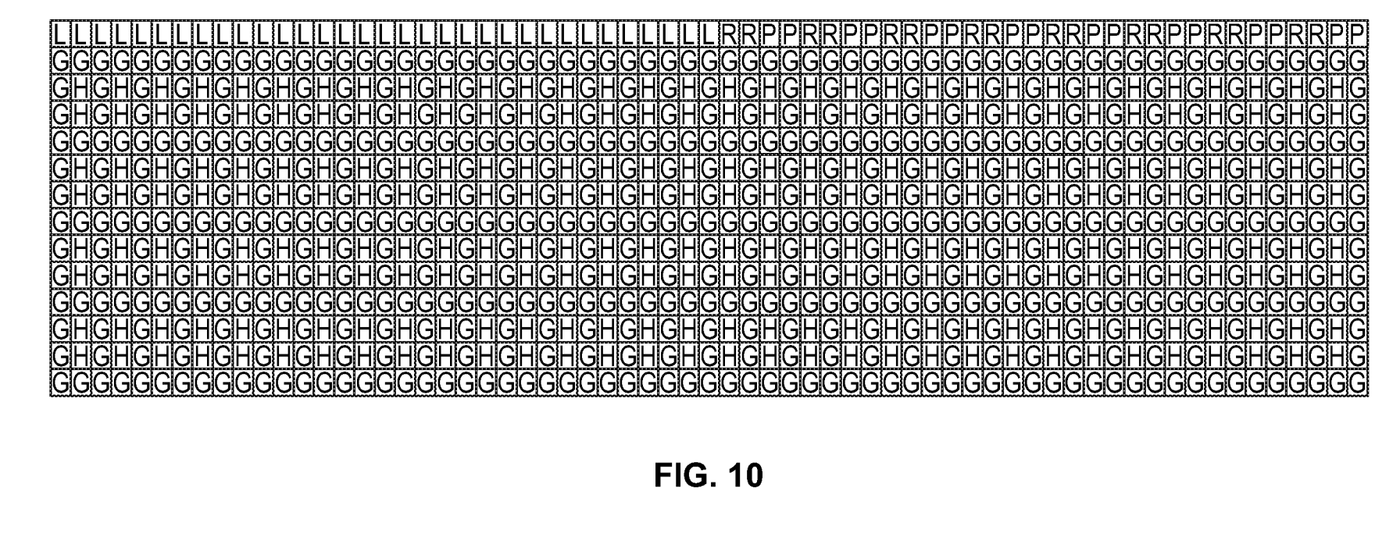
FIG. 10 is a schematic illustration of an exemplary pinout in accordance with an exemplary embodiment.

FIG. 10 is a schematic illustration of an exemplary pinout or contact layout for the pluggable module 104 (FIG. 9), the socket connector 112 (FIG. 4), and the host circuit board 110 (FIG. 3). The pinout illustrates conductors in an array arranged in a plurality of rows and a plurality of columns. Greater or fewer rows and greater or fewer columns may be used in other pinout embodiments.

The pinout illustrates power conductors P, power return conductors R, low speed signal conductors L, high speed signal conductors H, and ground conductors G. in the illustrated embodiment, the low speed signal conductors L, the power conductors P, and the power return conductors R are provided in the first row. The ground conductors G and the high-speed signal conductors H are provided in the second through fourteenth rows. Optionally, the high-speed signal conductors H are arranged in pairs that are surrounded by corresponding ground conductors G. in the illustrated embodiment, the pinout includes one hundred and twenty eight differential pairs.

Figure 11:
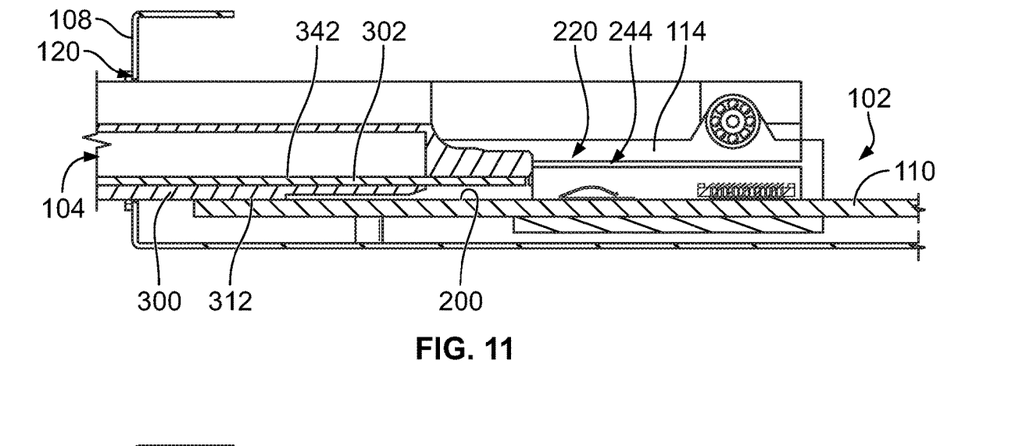
FIG. 11 illustrates the pluggable module at a first stage of mating in accordance with an exemplary embodiment.
Figure 12:
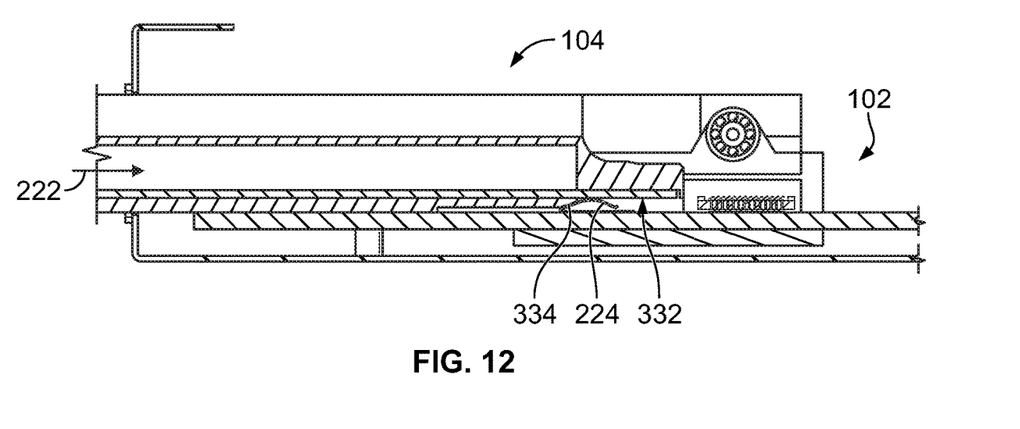
FIG. 12 illustrates the pluggable module at a second stage mating in accordance with an exemplary embodiment.
Figure 13:
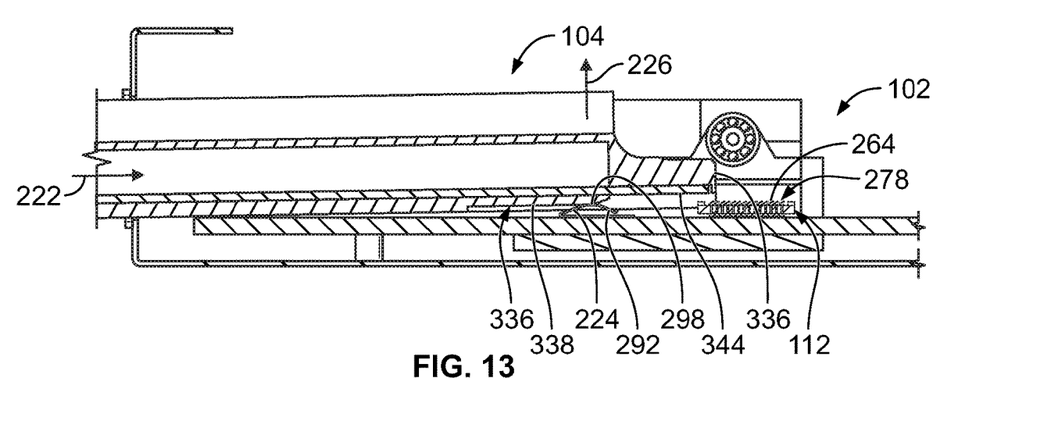
FIG. 13 illustrates the pluggable module at a third stage of mating in accordance with an exemplary embodiment.
Figure 14:
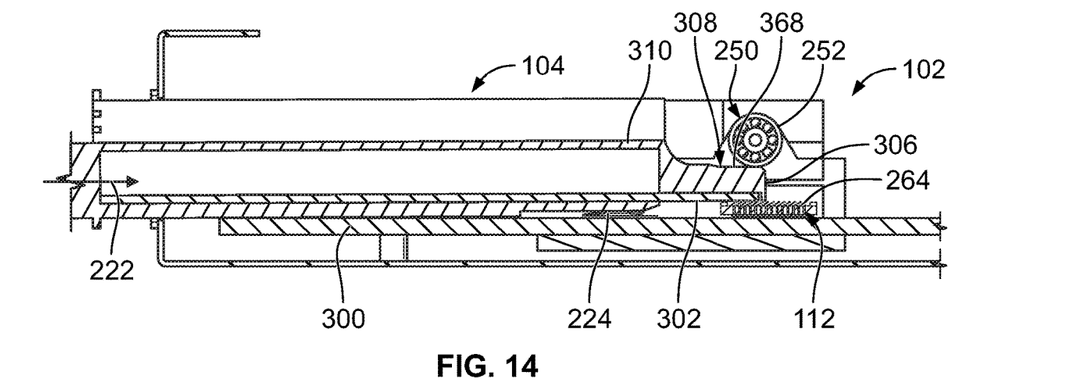
FIG. 14 illustrates the pluggable module at a fourth stage of mating in accordance with an exemplary embodiment.
Figure 15:
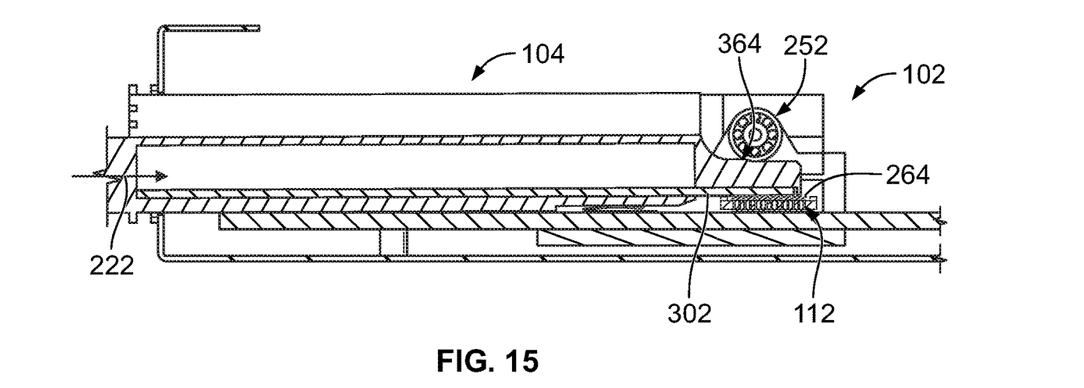
FIG. 15 illustrates the pluggable module at a fifth stage of mating in accordance with an exemplary embodiment.
Figure 16:
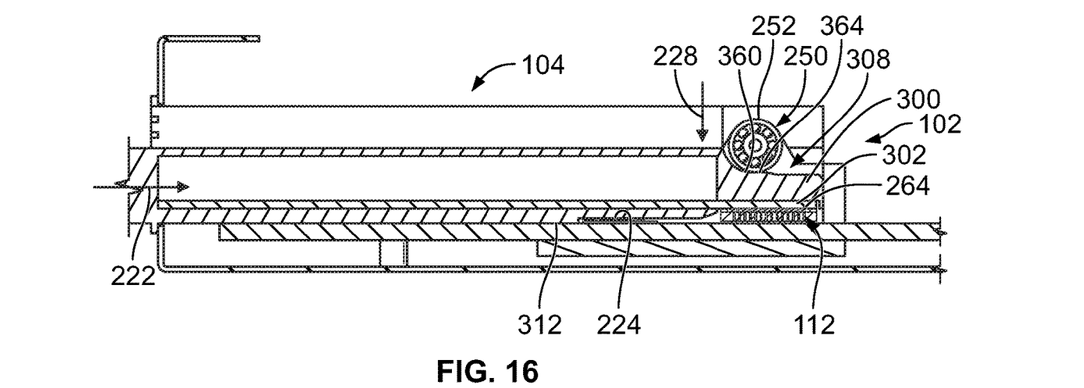
FIG. 16 illustrates the pluggable module at a sixth stage of mating in accordance with an exemplary embodiment.

FIGS. 11 through 16 illustrate the electrical connector system 100 showing the pluggable module 104 process stages of being mated with the circuit card assembly 102 in accordance with an exemplary embodiment. FIG. 11 illustrates the pluggable module 104 at a first stage of mating. FIG. 12 illustrates the pluggable module 104 at a second stage mating. FIG. 13 illustrates the pluggable module 104 at a third stage of mating. FIG. 14 illustrates the pluggable module 104 at a fourth stage of mating. FIG. 15 illustrates the pluggable module 104 at a fifth stage of mating. FIG. 16 illustrates the pluggable module 104 at a sixth stage of mating. FIG. 16 illustrates the pluggable module 104 fully mated with the circuit card assembly 102.

The pluggable module 104 is initially loaded into the module channel 220 between the guide rails 114 (FIG. 11). The pluggable module 104 is loaded through the panel opening 120 in the panel 108 to interface with the guide rails 114. The guide rails 114 position the pluggable module 104 such that the bottom 312 of the module body 300 slides just above the upper surface 200 of the host circuit board 110. The guide features 244 of the guide rail 114 generally prevent the module body 300 from touching the upper surface 200 of the host circuit board 100 and prevent lift off of the pluggable module 104 from the host circuit board 110.

As the pluggable module 104 is advanced (FIG. 12) in the module mating direction 222, the pluggable module 104 eventually interfaces with the lifter spring 224. The lifter spring 224 engages the lip 334 forward of the window 332. As the pluggable module 104 is further advanced (FIG. 13) in the module mating direction 222, the lifter spring 224 is received in the pocket 336 and engages the platform 338. The lifting surface 298 of the lifter spring 224 presses upward against the platform 338 to lift the pluggable module 104 upward in the lifting direction 226. The spring member 292 of the lifter spring 224 may be partially compressed by the weight of the pluggable module 104. The lifter spring 224 lifts the rear 306 of the module body 300 and the module circuit board 302 to a clearance position above the socket connector 112. The lower surface 344 of the module circuit board 302 is lifted to a vertical height above the mating interfaces 278 of the upper contacts 264. As such, further advancement of the pluggable module 104 is performed clear of the mating interfaces 278 of the upper contacts 264. Excessive wear or damage to the upper contacts 264 due to loading of the pluggable module 104 is reduced or eliminated because of the clearance between the module circuit board 302 and the upper contacts 264. Further advancement of the pluggable module 104 in the module mating direction 222 occurs with the pluggable module 104 in the lifted position.

As the pluggable module 104 is further advanced (FIG. 14) in the module mating direction 222, the rear 306 of the module body 300 engages the module actuator 250. The module actuator 250 interfaces with the actuation feature 308 of the pluggable module 104 to position the pluggable module 104 relative to the socket connector 112. The roller bearing 252 of the module actuator 250 initially engages the rear platform 368 along the top 310 of the module body 300 (FIG. 14). The lifter spring 224 holds the pluggable module 104 in the lifted position to provide clearance between the module circuit board 302 and the upper contacts 264 of the socket connector 112. Further advancement of the pluggable module 104 in the module mating direction 222 advances the bump 364 toward the roller bearing 252 (FIG. 15). When the roller bearing 252 engages the bump 364, the pluggable module 104 is almost fully loaded into the circuit card assembly 102 in the module mating direction 222. The module circuit board 302 has advanced over the socket connector 112. The module circuit board 302 is located directly vertically above the upper contacts 264.

When the pluggable module 104 is advanced to the fully mated position (FIG. 16), the module actuator 250 operably engages the actuation feature 308 of the pluggable module 104 to position the pluggable module 104 relative to the circuit card assembly 102. The module actuator 250 engages the actuation feature 308 to force mating of the module contacts 348 (FIG. 9) of the module circuit board 302 with the upper contacts 264 of the socket connector 112 of the circuit card assembly 102. The module actuator 250 forces the pluggable module 104 to move in the contact mating direction 228. The roller bearing 252 engages the cam surface 360 to guide mating in the contact mating direction 228. The roller bearing 252 forces the module body 300 downward to compress the upper contacts 264. The roller bearing 252 forces the module body 300 to compress the lifter spring 224. The bump 364 is forced under the roller bearing 252 as the pluggable module 104 is loaded rearward in the module mating direction 222. The downward movement of the module body 300 transfers the module circuit board 302 downward toward the socket connector 112. The module contacts 348 are mated with the upper contacts 264 in the contact mating direction 228 transverse to the module mating direction 222. The cam surface 360 transfers the generally horizontal loading of the pluggable module 104 to the generally vertical mating of the module contacts 348 with the upper contacts 264. The upper contacts 264 are arranged in a horizontal array and the module contacts 348 are arranged in a horizontal array that compresses the upper contacts 264 in a generally vertical contact mating direction 228. Other types of actuation features may be used in alternative embodiments to control mating of the pluggable module 104 with the socket connector 112.

The interaction between the lifter spring 224 and the pluggable module 104 protects the upper contacts 264 from damage, wear, and short-circuiting by providing clearance between the module circuit board 302 and the upper contacts 264 as the module circuit board 302 is loaded in the rearward module mating direction 222 until the module circuit board 302 is generally aligned vertically above the upper contacts 264. The module actuator 250 controls movement of the pluggable module 104 in the contact mating direction 228 once the pluggable module 104 is properly positioned relative to the socket connector 112. The open mating interface of the socket connector 112 and the open mating interface of the pluggable module 104 at the bottom 312 of the module body 300 allows connection of many rows of contacts at a compressible, separable interface, which is in contrast to conventional card edge connectors and circuit cards that limit the contacts to 1 or 2 upper row(s) and 1 or 2 lower row(s) on opposite sides of a circuit card.

Figure 17:
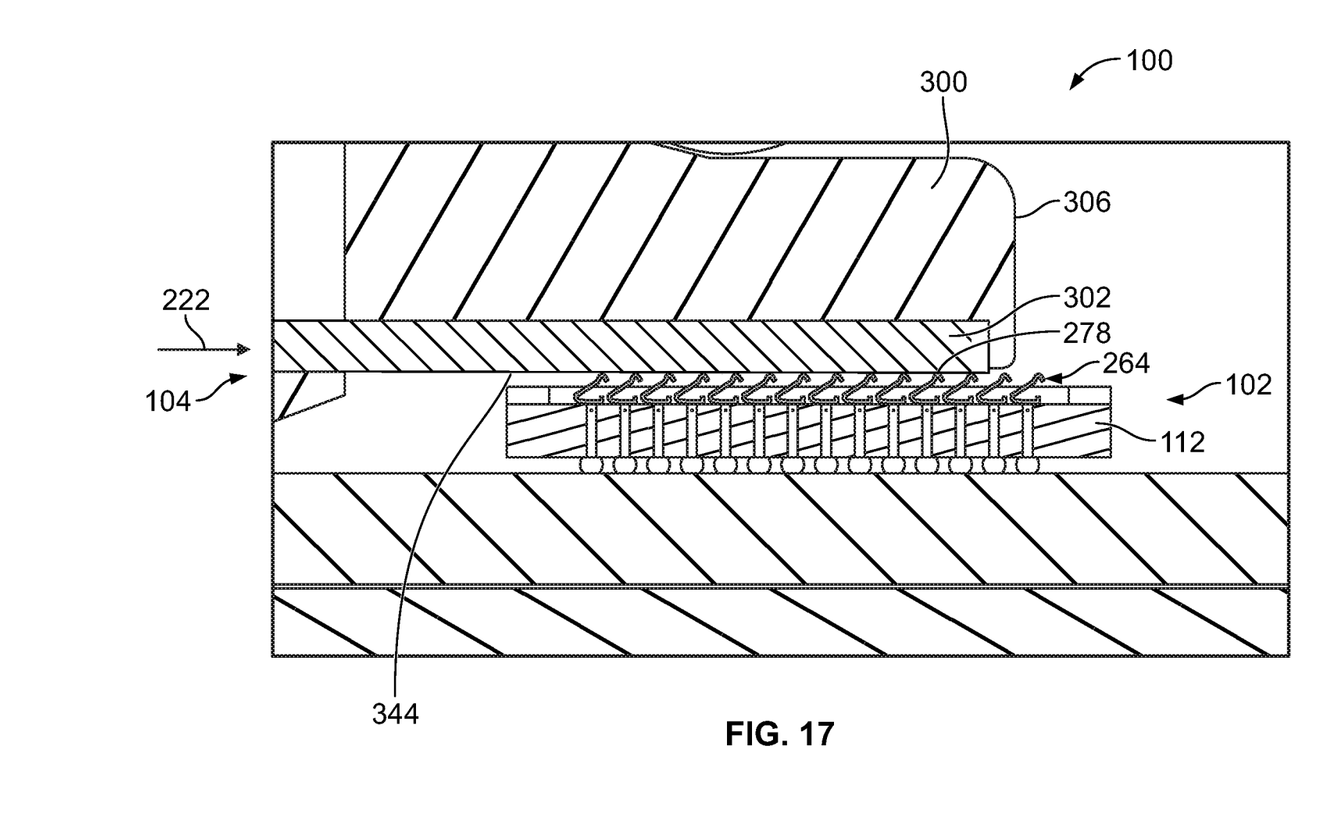
FIG. 17 is a cross sectional view of the electrical connector system showing the pluggable module partially mated with the circuit card assembly in accordance with an exemplary embodiment.

FIG. 17 is a cross sectional view of the electrical connector system 100 showing the pluggable module 104 partially mated with the circuit card assembly 102, such as at the stage of mating shown in FIG. 15. The lifter spring 224 (FIG. 13) lifts the rear 306 of the module body 300 and the module circuit board 302 to a clearance position above the socket connector 112. The lower surface 344 of the module circuit board 302 is lifted to a vertical height above the mating interfaces 278 of the upper contacts 264. Advancement of the pluggable module 104 is performed clear of the mating interfaces 278 of the upper contacts 264. Excessive wear or damage to the upper contacts 264 due to loading of the pluggable module 104 is reduced or eliminated because of the clearance between the module circuit board 302 and the upper contacts 264. Advancement of the pluggable module 104 in the module mating direction 222 occurs with the pluggable module 104 in the lifted position.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical connector system comprising:

a circuit card assembly including a host circuit board, a socket connector mounted to the host circuit board, and a guide rail extending along the host circuit board, the host circuit board having a contact array of circuit board contacts on an upper surface of the host circuit board, the socket connector having a socket substrate having an upper contact array of upper contacts and a lower contact array of lower contacts electrically connected to corresponding upper contacts, the upper contacts having mating interfaces being accessible from above the socket connector and being coplanar, the lower contacts being electrically connected to corresponding circuit board contacts, the guide rail having a guide feature including a guide rib extending from the guide rail, the guide rail having a module actuator separate from the guide feature;

a pluggable module including a module body having a top and a bottom extending between a front and a rear, the module body having a longitudinally extending guide feature including a channel receiving the guide rib and operatively engaging the guide rail to guide mating of the module body with the guide rail in a module mating direction parallel to the upper surface of the host circuit board, the module body having a window at the bottom proximate to the rear, the pluggable module including a module circuit board held by the module body, the module circuit board having a mating edge between an upper surface and a lower surface, the module circuit board having a module contact array of module contacts at the lower surface proximate to the mating edge aligned with the window with the module contacts exposed from below the module body for mating with corresponding upper contacts of the circuit card assembly, the pluggable module including an actuation feature at an exterior of the module body at the top of the module body separate from the guide feature, the actuation feature engaging the module actuator of the circuit card assembly, the actuation feature and the module actuator interfacing each other to force mating of the module contacts with the upper contacts of the circuit card assembly in a contact mating direction transverse to the module mating direction; and a lifter spring forward of the socket connector on the upper surface of the host circuit board, the lifter spring being compressible and imparting a spring bias on the pluggable module in a lifting direction to lift the pluggable module upward, wherein the guide rib is shifted vertically upward within the channel when the lifter spring lifts the pluggable module upward to move the pluggable module upward away from the host circuit board as the pluggable module is plugged into the socket connector and passes over the lifter spring prior to the actuation feature engaging the module actuator;

wherein the module actuator forces the pluggable module to move downward against the spring bias of the lifter spring to mate the module contacts of the pluggable module with the upper contacts, wherein the guide rib is shifted vertically downward within the channel when the module actuator moves the pluggable module in the contact mating direction; and wherein the channel includes an upper wall and a lower wall extending along a linear path along an entirety of the channel between a front and a rear of the channel, the guide rib being movable vertically within the channel between the upper wall and the lower wall in the lifting direction and the contact mating direction, wherein the channel extends substantially along an entire length of the module body and the guide rib extends substantially along an entire length of the guide rail, wherein the guide rib is located entirely within the channel between the front and the rear of the channel in the final mated position of the module contact array and the upper contact array of upper contacts of the socket substrate.

2. The electrical connector system of claim 1, wherein the socket connector includes a socket frame on an upper surface of the socket substrate surrounding the upper contact array, the socket frame having a socket cavity receiving the upper contacts, the socket frame having a support surface supporting the bottom of the pluggable module.

3. The electrical connector system of claim 1, wherein the upper contacts include spring beams being deflectable relative to the socket substrate.

4. The electrical connector system of claim 1, wherein the actuation feature is non-planar along the top of the module body.

5. The electrical connector system of claim 1, wherein the contact mating direction is generally perpendicular to the module mating direction.

6. The electrical connector system of claim 1, wherein the top includes a rear platform at the rear of the module body and a bump forward of the rear platform, the bump being elevated relative to the rear platform, the bump defining the actuation feature, the module body being moved downward in the contact mating direction when the bump engages the module actuator of the circuit card assembly.

7. The electrical connector system of claim 1, wherein the actuation feature is aligned with the module contact array and located above the module circuit board.

8. The electrical connector system of claim 1, wherein the actuation feature includes a detent interfacing with the module actuator of the circuit card assembly to move the module body and the module contacts in the contact mating direction.

9. The electrical connector system of claim 1, wherein the module contacts of the module contact array are arranged in at least three rows and at least three columns.

10. The electrical connector system of claim 1, wherein the socket substrate comprises a circuit board having vias between an upper surface and a lower surface of the socket substrate, the vias electrically connecting the upper contacts and the lower contacts.

11. The electrical connector system of claim 1, further comprising a panel forward of the host circuit board, the panel having a panel opening providing access to the upper surface of the host circuit board and the socket connector, the panel opening receiving the pluggable module for mating with the socket connector.

12. The electrical connector system of claim 1, further comprising a backer plate coupled to a lower surface of the host circuit board, the backer plate being coupled to the guide rail by fasteners extending through the host circuit board.

13. The electrical connector system of claim 1, further comprising a second socket connector mounted to the host circuit board, and a second guide rail extending along the host circuit board, the socket connector and the second socket connector being aligned with each other on opposite sides the host circuit board.

14. The electrical connector system of claim 1, wherein the module actuator includes a roller bearing configured to rotate along the pluggable module as the pluggable module is mated with the socket connector.

15. The electrical connector system of claim 1, wherein the actuation feature includes a cam surface transferring motion of the module body in the module mating direction to movement of the module contacts in the contact mating direction.

* * * * *